United States Patent
Ono et al.

(10) Patent No.: US 9,418,594 B2
(45) Date of Patent: Aug. 16, 2016

(54) DISPLAY DEVICE

(71) Applicant: JOLED INC., Tokyo (JP)

(72) Inventors: Shinya Ono, Osaka (JP); Hitoshi Tsuge, Osaka (JP); Kouhei Ebisuno, Kyoto (JP)

(73) Assignee: JOLED INC., Tokyo (JP)

( * ) Notice: Subject to any disclaimer, the term of this patent is extended or adjusted under 35 U.S.C. 154(b) by 34 days.

(21) Appl. No.: 14/460,368

(22) Filed: Aug. 15, 2014

(65) Prior Publication Data

US 2015/0070253 A1     Mar. 12, 2015

(30) Foreign Application Priority Data

Sep. 6, 2013  (JP) .................................. 2013-185216
May 28, 2014 (JP) .................................. 2014-110573

(51) Int. Cl.
*G09G 3/32*     (2016.01)
*H01L 27/12*    (2006.01)

(52) U.S. Cl.
CPC .......... *G09G 3/3233* (2013.01); *H01L 27/1222* (2013.01); *H01L 27/1225* (2013.01); *G09G 2300/0861* (2013.01); *G09G 2310/06* (2013.01); *G09G 2320/045* (2013.01)

(58) Field of Classification Search
CPC .............. G09G 3/3225; G09G 3/3233; G09G 2300/08; G09G 2300/0861; G09G 2310/06; G09G 2320/045
USPC .......................................................... 345/76
See application file for complete search history.

(56) References Cited

U.S. PATENT DOCUMENTS

| | | | |
|---|---|---|---|
| 2007/0065731 A1 | 3/2007 | Ishiwata | |
| 2008/0001545 A1 | 1/2008 | Uchino et al. | |
| 2009/0295699 A1* | 12/2009 | Korenari | H01L 27/1214 345/92 |
| 2011/0128211 A1* | 6/2011 | Ono | H01L 27/3265 345/76 |
| 2012/0287092 A1* | 11/2012 | Tatara | G09G 3/3233 345/204 |
| 2013/0200364 A1* | 8/2013 | Tokunaga | H01L 29/78636 257/43 |

FOREIGN PATENT DOCUMENTS

| | | |
|---|---|---|
| JP | 2007-086368 | 4/2007 |
| JP | 2008-310352 | 12/2008 |
| JP | 2013-161895 | 8/2013 |

\* cited by examiner

*Primary Examiner* — Amare Mengistu
*Assistant Examiner* — Jennifer Zubajlo
(74) *Attorney, Agent, or Firm* — Greenblum & Bernstein, P.L.C.

(57) ABSTRACT

A display device has a plurality of arrayed display pixels. A drive transistor includes a first gate electrode and supplies the current corresponding to a level of a luminance signal to the luminescence element. A switching transistor includes a source electrode, a drain electrode, a second gate electrode and a semiconductor layer. The semiconductor layer is faced with the second gate electrode and has, in a channel width direction perpendicular to a channel length direction of the switching transistor, a channel region with a first width and a remainder region with a second width larger than the first width. The source electrode or the drain electrode is connected to the first gate electrode. The source electrode and the drain electrode are provided on the semiconductor layer at an interval. The second gate electrode overlaps, in a plan view, the channel region entirely and the remainder region at least partially.

10 Claims, 9 Drawing Sheets

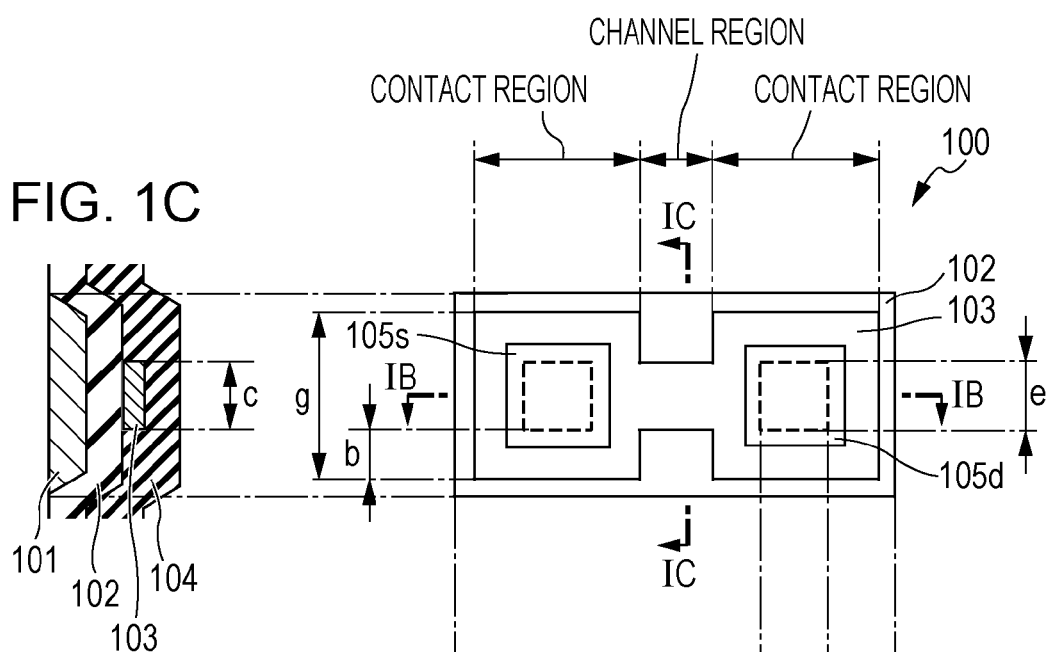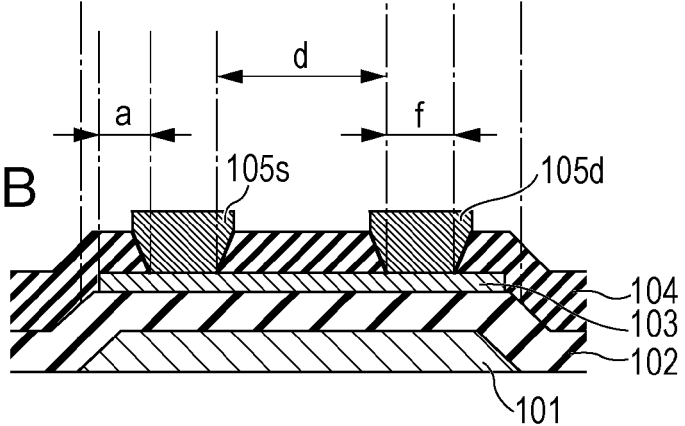

FIG. 2

| | COMPARATIVE EXAMPLE | PRESENT DISCLOSURE |
|---|---|---|
| a [μm] | 3 | 3 |
| b [μm] | 3 | 3 |
| c [μm] | 10 | 4 |
| d [μm] | 10 | 10 |
| e [μm] | 4 | 4 |
| f [μm] | 4 | 4 |
| OVERLAP AREA OF SEMICONDUCTOR LAYER AND GATE ELECTRODE [μm$^2$] | 240 | 216 |

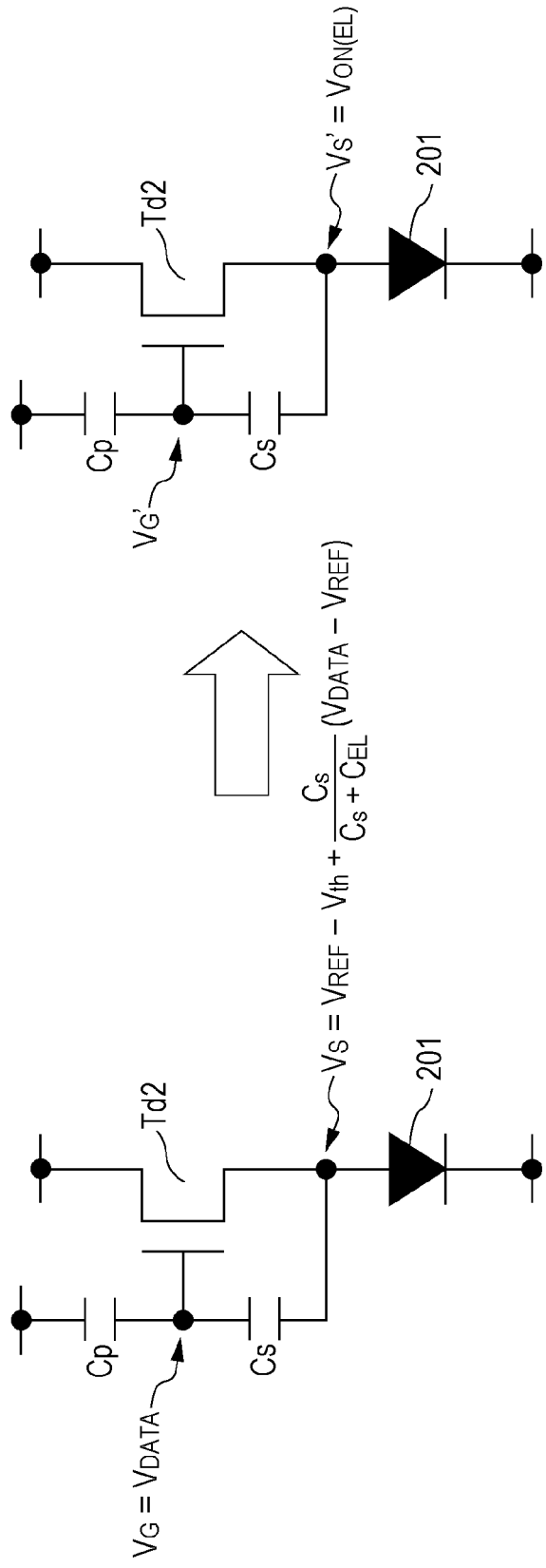

DISPLAY DEVICE

BACKGROUND OF THE INVENTION

1. Field of the Invention

The present disclosure relates to a display device.

2. Description of the Related Art

As an image display device using a current-driven luminescence element, an image display device using an organic electroluminescence (EL) element is known. The organic EL display device using the organic EL element that spontaneously emits light does not need a backlight, which is required for a liquid crystal display device, and is optimally contributes to reduction in size of the device. Also, the viewing angle of the device is not limited, and hence the device is expected to be practically used as a next-generation display device.

Japanese Unexamined Patent Application Publication No. 2008-310352 discloses a circuit configuration of a display pixel in an active matrix organic EL display device.

SUMMARY OF THE INVENTION

However, with such a display pixel, it is difficult to provide image display with high precision.

Accordingly, the present disclosure provides a display device that can provide image display with high precision.

An embodiment of a display device according to the present disclosure comprises a plurality of arrayed display pixels, each of the display pixels comprising: a luminescence element that emits light in accordance with a current; a drive transistor that includes a first gate electrode and supplies the current corresponding to a level of a luminance signal to the luminescence element; and a switching transistor that includes a source electrode, a drain electrode, a second gate electrode and a semiconductor layer, the semiconductor layer being faced with the second gate electrode and having, in a channel width direction perpendicular to a channel length direction of the switching transistor, a channel region with a first width and a remainder region with a second width larger than the first width, either the source electrode or the drain electrode being connected to the first gate electrode, both the source electrode and the drain electrode being provided on the semiconductor layer at an interval, the second gate electrode overlapping, in a plan view, the channel region entirely and the remainder region at least partially.

It is to be noted that a comprehensive embodiment or a specific embodiment may be provided by an electronic device, a system, an integrated circuit, or a driving method, or may be provided by a combination of at least any two of the electronic device, the system, the integrated circuit, and the driving method.

The display device according to the present disclosure can provide image display with high precision.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 1A is a plan view showing an example of the configuration of a switching transistor according to a first embodiment.

FIG. 1B is a cross sectional view taken along line IB-IB in FIG. 1A.

FIG. 1C is a cross sectional view taken along line IC-IC in FIG. 1A.

FIG. 2 is a table showing the sizes of respective portions of the switching transistor shown in FIGS. 1A to 1C.

FIG. 4A is a diagram for describing a gate voltage and a source voltage of a drive transistor at completion of data writing.

FIG. 4B is a diagram for describing the gate voltage and the source voltage of the drive transistor at emission of light.

DESCRIPTION OF THE PREFERRED EMBODIMENTS

Figure 3A:
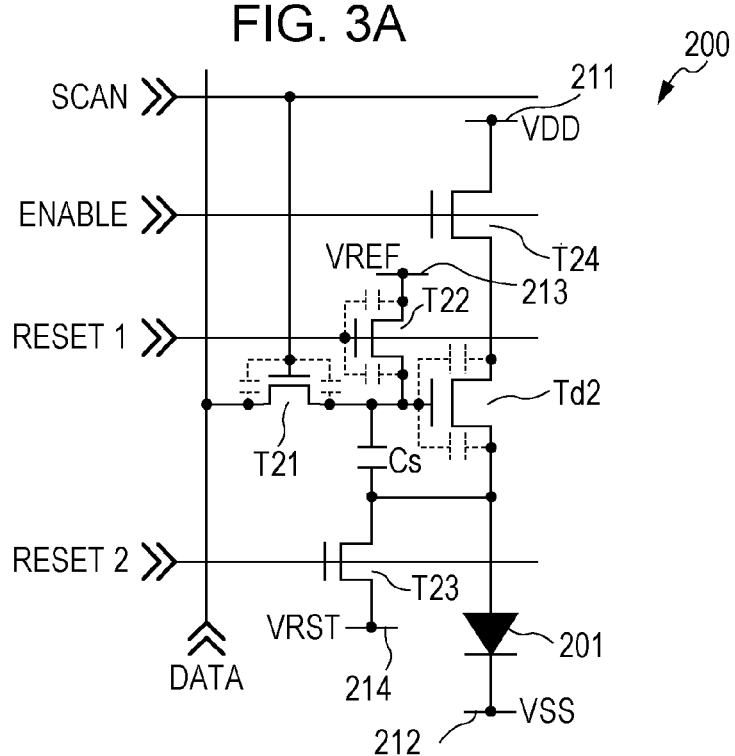
FIG. 3A is a circuit diagram showing an example of the configuration of a display pixel according to the first embodiment.

An embodiment of a display device according to the present disclosure comprises a plurality of arrayed display pixels, each of the display pixels comprising: a luminescence element that emits light in accordance with a current; a drive transistor that includes a first gate electrode and supplies the current corresponding to a level of a luminance signal to the luminescence element; and a switching transistor that includes a source electrode, a drain electrode, a second gate electrode and a semiconductor layer, the semiconductor layer being faced with the second gate electrode and having, in a channel width direction perpendicular to a channel length direction of the switching transistor, a channel region with a first width and a remainder region with a second width larger than the first width, either the source electrode or the drain electrode being connected to the first gate electrode, both the source electrode and the drain electrode being provided on the semiconductor layer at an interval, the second gate electrode overlapping, in a plan view, the channel region entirely and the remainder region at least partially.

As described above, in the switching transistor connected to the first gate electrode of the drive transistor, the first width of the channel region is smaller than the second width of the semiconductor layer other than the channel region. Hence, the parasitic capacitance of the switching transistor can be decreased. Accordingly, the parasitic capacitance accompanying the first gate electrode of the drive transistor can be decreased. Consequently, image display with high precision can be provided.

Also, the second gate electrode of the switching transistor may overlap an entire region of the semiconductor layer in the plan view.

Also, the semiconductor layer may include an oxide semiconductor.

Accordingly, since electron mobility is large while current of the switching transistor in the off-state is suppressed, high drive capacity can be provided.

Also, the switching transistor may further comprise an etching stopper layer being provided on the semiconductor layer and having a plurality of through holes corresponding to the source electrode and the drain electrode of the switching transistor.

Accordingly, when the source electrode and the drawing electrode of the switching transistor are formed by etching, the semiconductor layer can be protected from an etching damage.

Also, the drive transistor may further comprise a source electrode and a drain electrode. The luminescence element may further comprise an anode. Each of the display pixels may further comprise: a storage capacitor having a first electrode being in conduction with the first gate electrode of the drive transistor, and a second electrode being in conduction with the source electrode of the drive transistor and the anode of the luminescence element, the storage capacitor being configured to hold a voltage corresponding to the level of the luminance signal; a first switch having either a source electrode or a drain electrode of the first switch being connected to the first gate electrode of the drive transistor, the first switch being configured to switch conduction and non-conduction between a signal line for supplying the luminance signal and the first electrode of the storage capacitor; a second switch having either a source electrode or a drain electrode of the second switch being connected to the first gate electrode of the drive transistor, the second switch being configured to switch conduction and non-conduction between a first power source line and the first electrode of the storage capacitor; a third switch that switches conduction and non-conduction between the second electrode of the storage capacitor and a second power source line; and a fourth switch that switches conduction and non-conduction between a third power source line and the drain electrode of the drive transistor. The first switch and the second switch may be each the switching transistor.

As described above, in the display pixel, the first switch and the second switch are each the above-described switching transistor. Hence, image display with high precision, such as reduction in unevenness of the display screen, restriction of a decrease in capacity of threshold compensation, and support of display at a high frame rate, can be provided.

Alternatively, the drive transistor may further comprise a source electrode. The luminescence element may further comprise an anode. Each of the display pixels may further comprise: a first switch having either a source electrode or a drain electrode of the first switch being connected to the first gate electrode of the drive transistor; a storage capacitor having a first electrode being in conduction with the first gate electrode of the drive transistor through the first switch, and a second electrode being in conduction with the source electrode of the drive transistor and an anode of the luminescence element, the storage capacitor being configured to hold a voltage corresponding to the level of the luminance signal; a second switch having either a source electrode or a drain electrode of the second switch being connected to the first gate electrode of the drive transistor through the first switch, the second switch being configured to switch conduction and non-conduction between a signal line for supplying the luminance signal and the first electrode of the storage capacitor; and a third switch having either a source electrode or a drain electrode of the third switch being connected to the first gate electrode of the drive transistor, the third switch being configured to switch conduction and non-conduction between a power source line and the first gate electrode of the drive transistor. The first switch, the second switch and the third switch may be each the switching transistor.

Alternatively, the drive transistor may further comprise a source electrode. Each of the display pixels may comprise: a storage capacitor having a first electrode being in conduction with the first gate electrode of the drive transistor, the storage capacitor being configured to hold a voltage corresponding to the level of the luminance signal; a first switch that switches conduction and non-conduction between a signal line for supplying the luminance signal and the second electrode of the storage capacitor; a second switch having either a source electrode or a drain electrode of the second switch being connected to the first gate electrode of the drive transistor, the second switch being configured to switch conduction and non-conduction between a power source line and the first electrode of the storage capacitor; and a third switch that switches conduction and non-conduction between the second electrode of the storage capacitor and the source electrode of the drive transistor. The second switch may be the switching transistor.

As described above, in the display pixel, the first switch is the above-described switching transistor. Hence, image display with high precision, such as the reduction in unevenness of the display screen, and the support of the display at a high frame rate, can be provided.

Also, the display device may further comprise: a controller configured to: cause the storage capacitor to hold the voltage corresponding to the level of the luminance signal; after the holding of the voltage, execute a bootstrap operation, at the bootstrap operation, i) the first electrode of the storage capacitor being in conduction with the first gate electrode of the drive transistor and the second electrode of the storage capacitor being in conduction with the source electrode of the drive transistor, ii) a potential of the source electrode of the drive transistor being changed by current flowing to the drive transistor, and iii) a potential of the first gate electrode of the drive transistor being changed by the changing of the potential of the source electrode of the drive transistor; and cause the luminescence element to emit light through the bootstrap operation.

Also, a semiconductor layer of the drive transistor may have a third width in a channel width direction perpendicular to a channel length direction of the drive transistor, the third width being substantially constant in the channel length direction of the drive transistor.

Accordingly, ON characteristics of the drive transistor can be restrained from being degraded.

An embodiment of a display device according to the present disclosure is specifically described below with reference to the drawings. However, excessively detailed description more than required may be occasionally omitted. For example, detailed description for a matter that is well known or redundant description for substantially the same configurations may be occasionally omitted. This is to avoid the following description from being unnecessarily redundant, and to allow the person skilled in the art to easily understand the description.

It is to be noted that the inventors provide the accompanying drawings and the following description to allow the person skilled in the art to sufficiently understand the present disclosure; however, the inventors do not intend to limit the subjects described in the claims by the drawings and description. For example, numerical values, shapes, materials, components, arrangement positions and connection forms of the components described in embodiments described below are merely examples, and these are not provided to limit the present disclosure. Also, components, which are not described in the independent claim indicative of the generic concept, among components according to the embodiments described below, are described as arbitrary components. Also, the respective drawings provided below are merely schematic views, and are not necessarily strictly illustrated.

First Embodiment

A display device according to this embodiment includes a plurality of arrayed display pixels each including a luminescence element that emits light in accordance with supplied current, a drive transistor that supplies the current corresponding to a level of a luminance signal to the luminescence element, and a switching transistor, a source electrode or a drain electrode of which is connected to a gate electrode of the drive transistor.

Configuration of Switching Transistor

First, the configuration of a switching transistor according to this embodiment is described. FIG. 1A is a plan view showing an example of the configuration of a switching transistor according to a first embodiment. FIG. 1B is a cross sectional view taken along line IB-IB in FIG. 1A. FIG. 1C is a cross sectional view taken along line IC-IC in FIG. 1A. In FIG. 1A, a gate electrode and a semiconductor layer (described later) are illustrated in a perspective manner.

As shown in FIG. 1B, a switching transistor 100 according to this embodiment includes a gate electrode 101 formed on a substrate (not shown), a gate insulating film 102 provided to face the gate electrode 101, a semiconductor layer 103 provided on the gate insulating film 102, and a source electrode 105s and a drain electrode 105d provided on the semiconductor layer 103 at an interval. The switching transistor 100 further includes an etching stopper layer 104 provided on the semiconductor layer 103 and having a plurality of through holes corresponding to the source electrode 105s and the drain electrode 105d.

The gate electrode 101 overlaps an entire region of a channel region of the semiconductor layer 103, and at least part of a contact region, which is a region of the semiconductor layer other than the channel region in plan view. Hereinafter, the region of the semiconductor layer 103 other than the channel region may be written as contact region.

Also, a width c of the channel region is smaller than a width g of the contact region. Hence, the switching transistor 100 according to this embodiment can decrease a parasitic capacitance as compared with a switching transistor in which the width c of the channel region is equivalent to the width g of the contact region. The detail is described later.

The "width" of the semiconductor layer 103 represents the length of the semiconductor layer 103 in a direction orthogonal to an arrangement direction of the source electrode 105s and the drain electrode 105d in plan view of the switching transistor 100. That is, the "width" of the semiconductor layer 103 represents the length of the semiconductor layer 103 in a direction orthogonal to a moving direction of electrons in the semiconductor layer 103. In other words, the "width" of the semiconductor layer 103 represents the length of the semiconductor layer 103 in a channel width direction perpendicular to a channel length direction.

FIG. 2 is a table showing the sizes of respective portions of the switching transistor shown in FIGS. 1A to 1C. While the switching transistor in which the width c of the channel region is equivalent to the width g of the contact region serves as a comparative example, this table shows the sizes of respective portions of the switching transistor according to this comparative example, the sizes of respective portions of the switching transistor according to this embodiment (in the drawing, written as present disclosure), and the overlap areas of the semiconductor layers and the gate electrodes with such size configurations. The sizes of the respective portions in each of the comparative example and this embodiment include (i) an alignment margin a in a channel length direction of the source electrode 105s and the drain electrode 105d with respect to the semiconductor layer 103, (ii) an alignment margin b in a channel width direction of the source electrode 105s and the drain electrode 105d with respect to the semiconductor layer 103, (iii) the width c of the channel region, (iv) a distance d between the source electrode 105s and the drain electrode 105d being in contact with the semiconductor layer 103, (v) a length e in the channel width direction of a contact portion of the source electrode 105s and the drain electrode 105d with respect to the semiconductor layer 103, and (vi) a length f in the channel length direction of the contact portion.

As shown in FIG. 2, the shape of the switching transistor according to the comparative example is substantially similar to the shape of the switching transistor according to this embodiment except the width c of the channel region. That is, the width c of the channel region is the same as the width g of the contact region in the comparative example, whereas the width c of the channel region is smaller than the width g of the contact region in this embodiment. In other words, in plan view, the semiconductor layer according to the comparative example has a rectangular shape, whereas the semiconductor layer 103 of this embodiment has a shape with a dented portion provided in a center portion of the rectangular shape.

Accordingly, the overlap area of the semiconductor layer and the gate electrode is 240 $\mu m^2$ in the comparative example, whereas the overlap area is 216 $\mu m^2$ in this embodiment. The area of this embodiment is smaller than the area of the comparative example.

The numerical values shown in the table in FIG. 2 are merely examples, and the sizes of the respective portions of the switching transistor 100 according to this embodiment are not limited thereto. For example, in FIG. 2, (iii) the width c of the channel region is equivalent to (v) the length e in the channel width direction of the contact portion; however, these values may be different, and the magnitude correlation may be desirably determined.

Respective components of the switching transistor 100 according to this embodiment are described below in detail.

Gate Electrode

The gate electrode 101 is an electrode formed on a substrate. The gate electrode 101 may be made of, for example, metal, such as gold (Au), silver (Ag), aluminum (Al), nickel (Ni), molybdenum (Mo), copper (Cu), tungsten, titanium, manganese, or chrome; an alloy, such as aluminum molybdenum, copper molybdenum, copper manganese, or molybdenum tungsten; or a transparent conductive material, such as indium tin oxide (ITO), aluminum-doped zinc oxide (AZO), or gallium-doped zinc oxide (GZO). Also, these materials may be laminated and form a multilayer structure.

Gate Insulating Film

The gate insulating film 102 is provided to cover the gate electrode 101. The gate insulating film 102 may be made of, for example, a monolayer structure of a silicon oxide film or a silicon nitride film; or a multilayer structure in which these materials are laminated. Alternatively, a multilayer structure, in which these materials and a silicon oxynitride film, an aluminum oxide film, a tantalum oxide film, a hafnium oxide film, etc. are laminated, may be used.

Semiconductor Layer

The semiconductor layer 103 faces the gate electrode 101. To be specific, as described above, the semiconductor layer 103 is provided such that the entire region of the contact region and the entire region of the channel region overlap the gate electrode 101. That is, the entire region of the semiconductor layer 103 is provided to overlap the gate electrode 101. In other words, the semiconductor layer 103 is arranged in the region included in the gate electrode 101 when viewed in a laminating direction.

The semiconductor layer 103 may be made of, for example, an oxide semiconductor material containing at least one kind of indium (In), gallium (Ga), and zinc (Zn). For example, amorphous indium gallium zinc oxide (InGaZnO) may be used. In this way, by using the oxide semiconductor material for the semiconductor layer 103, current in the off-state of the switching transistor 100 can be suppressed. Also, since the electron mobility is large, high drive capacity can be provided.

As described above, the width of the channel region is smaller than the width of the contact region. As shown in FIG. 1A, the semiconductor layer 103 has a shape in which the channel region is dented with respect to the contact region in plan view.

In this way, since the width of the channel region is smaller than the width of the contact region, the parasitic capacitance of the switching transistor 100 can be decreased as described above. The reason is as follows.

That is, the parasitic capacitance of the switching transistor 100 is affected by the overlap area of the gate electrode 101 and the semiconductor layer 103, and the gate insulating film 102 arranged between the gate electrode 101 and the semiconductor layer 103. A method of decreasing the parasitic capacitance may be (i) increasing the thickness of the gate insulating film 102, and (ii) decreasing the overlap area of the gate electrode 101 and the semiconductor layer 103.

However, if (i) the thickness of the gate insulating film 102 is increased, ON characteristics of a drive transistor, a gate electrode of which is connected to the switching transistor 100, is degraded. Hence, pixel current is decreased, and consequently the luminance is decreased.

Hence, a preferable method of decreasing the parasitic capacitance of the switching transistor 100 is (ii) decreasing the overlap area of the gate electrode 101 and the semiconductor layer 103. Thus, in the switching transistor 100 according to this embodiment, the parasitic capacitance of the switching transistor 100 is decreased by decreasing the width of the channel region as compared with the width of the contact region.

Accordingly, the parasitic capacitance of the switching transistor 100 can be decreased without degrading the ON characteristics of the drive transistor, the gate electrode of which is connected to the switching transistor 100.

Etching Stopper Layer

The etching stopper layer 104 is an insulating layer that is provided to cover the semiconductor layer 103 for protecting the semiconductor layer 103 from an etching damage. The etching stopper layer 104 may be made of, for example, a monolayer structure of a film made of an inorganic material, such as a silicon oxide film, a silicon nitride film, a silicon oxynitride film, or an aluminum oxide film; or a film mainly containing an organic material, such as silicon, oxygen, or carbon. Alternatively, the etching stopper layer 104 may be made of a multilayer structure in which these films are laminated.

The etching stopper layer 104 has a plurality of through holes corresponding to the source electrode 105s and the drain electrode 105d. The through holes are made by, for example, a photolithography method and an etching method.

Source Electrode, Drain Electrode

The source electrode 105s and the drain electrode 105d are provided on the semiconductor layer 103 at an interval. The source electrode 105s and the drain electrode 105d may each be made of, for example, metal, such as gold (Au), silver (Ag), aluminum (Al), nickel (Ni), molybdenum (Mo), copper (Cu), tungsten, titanium, manganese, or chrome; an alloy, such as aluminum molybdenum, copper molybdenum, copper manganese, or molybdenum tungsten; or a transparent conductive material, such as indium tin oxide (ITO), aluminum-doped zinc oxide (AZO), or gallium-doped zinc oxide (GZO). Also, these materials may be laminated and form a multilayer structure.

Part of the source electrode 105s and part of the drain electrode 105d are embedded in the through holes formed in the etching stopper layer 104. That is, the source electrode 105s and the drain electrode 105d are in contact with the semiconductor layer 103 through the through holes made in the etching stopper layer 104.

Display Pixel

The display pixel according to this embodiment includes the above-described switching transistor 100 and the drive transistor, the gate electrode of which is connected to the switching transistor 100, and hence image display with high precision can be provided. The display pixel according to this embodiment is specifically described below.

Configuration

FIG. 3A is a circuit diagram showing the configuration of the display pixel according to this embodiment. It is to be noted that a capacitance plotted with dotted lines in the same circuit diagram is a parasitic capacitance of each component connected to a gate electrode of a drive transistor Td2. Parasitic capacitances of other components are omitted.

As shown in the drawing, a display pixel 200 according to this embodiment includes an EL element 201, the drive transistor Td2, and switching transistors T21 and T22, source electrodes or drain electrodes of which are connected to the gate electrode of the drive transistor Td2. The display pixel 200 further includes a storage capacitor Cs, and switching transistors T23 and T24.

The EL element 201 is an example of a luminescence element and emits light in accordance with supplied current. An anode of the EL element 201 is connected to a positive power source line 211 through the drive transistor Td2 and the switching transistor T24. A voltage VDD is applied to the positive power source line 211. A cathode of the EL element 201 is connected to a negative power source line 212. A voltage VSS is applied to the negative power source line 212.

The drive transistor Td2 supplies current corresponding to a luminance signal to the EL element 201.

A first electrode of the storage capacitor Cs is in conduction with the gate electrode of the drive transistor Td2. A second electrode of the storage capacitor Cs is in conduction with a source electrode of the drive transistor Td2 and the anode of the EL element 201. The storage capacitor Cs holds a voltage corresponding to the luminance signal.

The switching transistor T21 is an example of a first switch, and is, for example, a thin film transistor (TFT). A source electrode or a drain electrode of the switching transistor T21 is connected to the gate electrode of the drive transistor Td2. The switching transistor T21 switches between conduction and non-conduction of between a signal line for supplying the luminance signal and the first electrode of the storage capacitor Cs.

The switching transistor T22 is an example of a second switch, and is, for example, TFT. A source electrode or a drain electrode of the switching transistor T22 is connected to the gate electrode of the drive transistor Td2. The switching transistor T22 switches between conduction and non-conduction of between a reference power source line 213 (first power source line) and the gate electrode of the drive transistor Td2. A voltage VREF is applied to the reference power source line 213.

The switching transistor T23 is an example of a third switch, and is, for example, TFT. The switching transistor T23 switches between conduction and non-conduction of between the anode of the EL element 201 and a reset line 214 (second power source line). A voltage VRST is applied to the reset line 214.

The switching transistor T24 is an example of a fourth switch, and is, for example, TFT. The switching transistor T24 switches between conduction and non-conduction of between the positive power source line 211 (third power source line), to which the voltage VDD is applied, and the drain electrode of the drive transistor Td2.

The switching transistors T21 and T22 each have the configuration of the above-described switching transistor 100. That is, in each of the switching transistors T21 and T22, the width of the channel region of the semiconductor layer is smaller than the width of the region of the semiconductor layer other than the channel region.

Also, the drive transistor Td2 has a configuration substantially similar to the switching transistors T21 and T22. However, in some cases, the drive transistor Td2 desirably lacks the small-width portion in the semiconductor layer.

This is because the drive transistor Td2 is requested to have high current supply capacity. That is, the drive transistor Td2 is requested to have good ON characteristics. However, the ON characteristics depend on the channel width of the drive transistor Td2, and are degraded as the channel width is decreased. Owing to this, the drive transistor Td2 lacks the small-width portion in the semiconductor layer in plan view, and thus a large channel width is ensured. That is, the semiconductor layer of the drive transistor Td2 has a length in the channel width direction being substantially constant along the channel length direction. That is, the semiconductor layer has a substantially rectangular shape in plan view.

Accordingly, the ON characteristics of the drive transistor Td2 can be restrained from being degraded, and high current supply capacity can be provided.

However, as the display pixel size is decreased, the display resolution is increased. If the display luminance of the display device is constant, the current required for each pixel is decreased as the resolution is increased. In this case, the semiconductor layer may have the small-width portion in the semiconductor layer to decrease the parasitic capacitance of the drive transistor Td2.

Operation

Figure 3B:
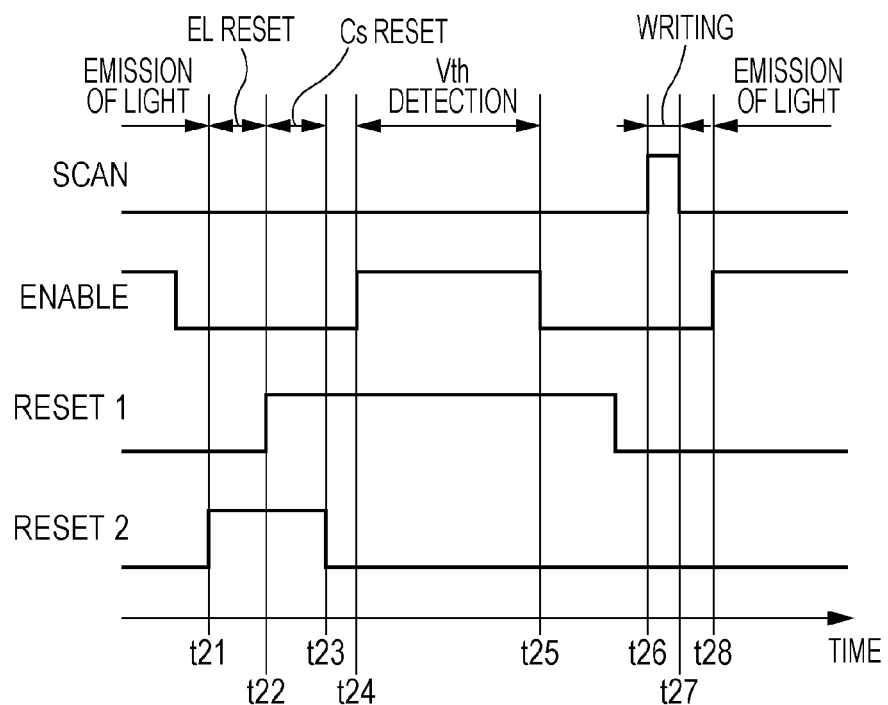
FIG. 3B is a timing chart showing an example of the operation of the display pixel according to the first embodiment.

Next, the operation of the thus configured display pixel 200 according to this embodiment is described. FIG. 3B is a timing chart showing an example of the operation of the display pixel 200 according to this embodiment. FIGS. 4A and 4B are diagrams for describing the gate voltage and the source voltage of the drive transistor Td2. FIG. 3B shows respective voltage waveforms of SCAN which is a signal applied to a gate of the switching transistor T21, ENABLE is a signal applied to a gate of the switching transistor T24, RESET1 is a signal applied to a gate of the switching transistor T22, and RESET2 is a signal applied to a gate of the switching transistor T23.

First, at time t21, while the voltage levels of SCAN, ENABLE, and RESET1 are maintained at LOW, the voltage level of RESET2 is switched from LOW to HIGH. That is, at time t21, while the switching transistors T21, T22, and T24 are in the non-conductive state (off-state), the switching transistor T23 becomes the conductive state (on-state).

Accordingly, the voltage of the anode of the EL element 201 is reset at VRST.

Then, at time t22, while the voltage levels of SCAN and ENABLE are maintained at LOW and the voltage level of RESET2 is maintained at HIGH, the voltage level of RESET1 is switched from LOW to HIGH. That is, at time t22, while the switching transistors T21 and T24 are in the non-conductive state (off-state) and the switching transistor T23 is in the conductive state (on-state), the switching transistor T22 becomes the conductive state (on-state).

Accordingly, the potential of the gate electrode of the drive transistor Td2 is set at the voltage VREF of the reference power source line 213. Since the switching transistor T23 is in the conductive state, the potential of the source electrode of the drive transistor Td2 is set at the voltage VRST of the reset line 214. That is, the voltage VREF of the reference power source line 213 is applied to the gate electrode of the drive transistor Td2 and the first electrode of the storage capacitor Cs. The voltage VRST of the reset line 214 is applied to the source electrode of the drive transistor Td2, the second electrode of the storage capacitor Cs, and the anode of the EL element 201. The VRST voltage is previously set to satisfy VRST−VSS<Vth(EL). Vth(EL) is a light emission start voltage of the EL element 201. For example, if VSS=0 V and Vth(EL)=2 V, VRST=−5 V can be set.

Then, at time t23, while the voltage levels of SCAN and ENABLE are maintained at LOW and the voltage level of RESET1 is maintained at HIGH, the voltage level of RESET2 is switched from HIGH to LOW. That is, at time t23, while the switching transistors T21 and T24 are in the non-conductive state (off-state) and the switching transistor T22 is in the conductive state (on-state), the switching transistor T23 becomes the non-conductive state (off-state).

Accordingly, flow-through current can be restrained from flowing between the positive power source line 211 and the reset line 214 through the switching transistor T24, the drive transistor Td2, and the switching transistor T23. The operation can be shifted to a Vth detection operation.

Then, at time t24, while the voltage levels of SCAN and RESET2 are maintained at LOW and the voltage level of RESET1 is maintained at HIGH, the voltage level of ENABLE is switched from LOW to HIGH. That is, at time t24, while the switching transistors T21 and T23 are maintained in the non-conductive state (off-state) and the switching transistor T22 is maintained in the conductive state (on-state), the switching transistor T24 becomes the conductive state (on-state), and the Vth detection operation is started.

At this time, since the EL element 201 is in a reverse-biased voltage state, the EL element 201 only functions as a capacitance, and does not emit light. In contrast, drain current is supplied to the drive transistor Td2 by the voltage VDD of the positive power source line 211, and a source potential of the drive transistor Td2 is changed accordingly. In other words, the source potential of the drive transistor Td2 is changed until a potential at which the drain current supplied by the voltage VDD of the positive power source line 211 becomes 0.

In this way, while the voltage VREF of the reference power source line 213 is input to the gate electrode of the drive transistor Td2, if the switching transistor T24 becomes the conductive state (on-state), the Vth detection period of the drive transistor Td2 can be started.

Then, when the Vth detection period is ended (time t25), the voltage level of ENABLE is switched from HIGH to LOW. A gate-source voltage of the drive transistor Td2 has a potential difference corresponding to a threshold of the drive transistor Td2. The voltage is held (stored) in the storage capacitor Cs and the EL element 201.

Then, by switching the voltage level of RESET1 from HIGH to LOW, the switching transistor T22 is turned off.

$$V'_G = V_{DATA} + \frac{C_S}{C_S + C_P}\left\{V_{ON(EL)} - \left[V_{REF} - V_{th} + \frac{C_S}{C_S + C_{EL}}(V_{DATA} - V_{REF})\right]\right\} \quad (3)$$

$$= V_{DATA} + \frac{C_S}{C_S + C_P}\left\{V_{ON(EL)} - \left(\frac{C_S}{C_S + C_{EL}}V_{REF} + \frac{C_S}{C_S + C_{EL}}V_{DATA} - V_{th}\right)\right\}.$$

Then, at time t26, while the voltage levels of ENABLE, RESET1, and RESET2 are maintained at LOW, the voltage level of SCAN is switched from LOW to HIGH. That is, at time t26, while the switching transistors T22 to T24 are in the non-conductive state (off-state), the switching transistor T21 becomes the conductive state (on-state).

Accordingly, in addition to a threshold voltage Vth of the drive transistor Td2 stored in the period from time t24 to time t25, a value obtained by multiplying the voltage difference between a luminance signal voltage and the voltage VREF of the reference power source line 213 by (capacitance of EL element 201)/(capacitance of EL element 201+capacitance of storage capacitor Cs) is stored (held) in the storage capacitor Cs.

To be specific, if $C_S$ is a capacitance of the storage capacitor Cs, $C_{EL}$ is a capacitance of the EL element 201, and $V_{DATA}$ is a voltage of the luminance signal DATA, as shown in FIG. 4A, a gate voltage $V_G$ of the drive transistor Td2 is expressed by Expression (1) as follows:

$$V_G = V_{DATA} \quad (1).$$

Also, the source voltage Vs of the drive transistor Td2 is expressed by Expression (2). That is, the source voltage Vs at completion of writing the luminance signal DATA is expressed by Expression (2). In the expression, VREF and Vth may be occasionally written as $V_{REF}$ and $V_{th}$. Expression (2) is as follows:

$$V_S = V_{REF} - V_{th} + \frac{C_S}{C_S + C_{EL}}(V_{DATA} - V_{REF}). \quad (2)$$

Then, at time t27, while the voltage levels of ENABLE, RESET1, and RESET2 are maintained at LOW, the voltage level of SCAN is switched from HIGH to LOW. That is, at time t27, while the switching transistors T22 to T24 are in the non-conductive state (off-state), the switching transistor T21 becomes the non-conductive state (off-state).

Accordingly, the switching transistor T21 can reliably become the non-conductive state (off-state) before the switching transistor T24 becomes the conductive state (on-state) at subsequent time t28.

Finally, at time t28, while the voltage levels of SCAN, RESET1, and RESET2 are maintained at LOW, the voltage level of ENABLE is switched from LOW to HIGH. That is, at time t28, while the switching transistors T21 to T23 are maintained in the non-conductive state (off-state), the switching transistor T24 becomes the conductive state (on-state).

In this way, since the switching transistor T24 becomes the conductive state (on-state), the drive transistor Td2 supplies the current corresponding to the voltage stored in the storage capacitor Cs to the EL element 201. Consequently, the EL element 201 emits light.

If it is assumed that a source voltage $V_S'$ of the drive transistor Td2 at this time is $V_{ON(EL)}$, a gate voltage $V_G'$ of the drive transistor Td2 is expressed by Expression (3). That is, the gate voltage $V_G'$ at emission of light is expressed by Expression (3) as follows:

In the expression, $C_P$ is a combined parasitic capacitance of the switching transistors (switching transistors T21 and T22) connected to the gate electrode of the drive transistor Td2.

In this way, from the completion of writing the luminance signal DATA to the emission of light, the source voltage of the drive transistor Td2 varies from the voltage expressed by Expression (2) to $V_{ON(EL)}$. Accordingly, the gate voltage of the drive transistor Td2 also varies. After the writing of the luminance signal DATA, the source voltage of the drive transistor Td2 is changed by the current flowing to the drive transistor Td2, and hence the gate voltage of the drive transistor Td2 is changed. Such an operation is called "bootstrap operation."

In an ideal state in which there is no parasitic capacitance accompanying the gate electrode of the drive transistor Td2, that is, in an ideal state with no combined parasitic capacitance Cp, the variation of the gate voltage is $V_S' - V_S$, which is the variation of the source voltage. However, the combined parasitic capacitance Cp is actually present, and hence the variation of the gate voltage is determined by capacitance division of the combined parasitic capacitance Cp and the storage capacitor Cs with respect to the variation of the source voltage. Consequently, the gate voltage $V_G'$ at the emission of light is a value affected by the capacitance division of the combined parasitic capacitance Cp and the storage capacitor Cs as expressed by Expression (3).

Accordingly, the gate-source voltage V of the drive transistor Td2 at the emission of light is expressed by Expression (4) as follows:

$$V_{GS} = \left(1 - \frac{C_S}{C_S + C_P}\frac{C_S}{C_S + C_{EL}}\right)V_{DATA} - \frac{C_S}{C_S + C_P}\frac{C_{EL}}{C_S + C_{EL}}V_{REF} - \frac{C_P}{C_S + C_P}V_{ON(EL)} + \frac{C_S}{C_S + C_P}V_{th} \quad (4)$$

As it is found from later two terms (third and fourth terms) in Expression (4), the gate-source voltage $V_{GS}$ of the drive transistor Td2 at the emission of light is more dependent on $V_{ON(EL)}$ and the coefficient of $V_{th}$ is decreased from 1 as the combined parasitic capacitance $C_P$ is larger. That is, as the combined parasitic capacitance $C_P$ is larger, the gate-source voltage $V_{GS}$ of the drive transistor Td2 at the emission of light is more deviated from an ideal value. Thus, since the pixel current amount is deviated from an ideal current amount, the luminance of the display pixel is deviated from an ideal luminance. Consequently, it is difficult to provide image display with high precision.

In this way, when the EL element 201 emits light through the bootstrap operation of the drive transistor Td2 after the completion of writing the luminance signal DATA, as the combined parasitic capacitance $C_P$ is larger, the luminance of the display pixel is more deviated from the ideal luminance.

In the display pixel 200 according to this embodiment, the switching transistors (switching transistors T21 and T22) connected to the gate electrode of the drive transistor Td2 each have the configuration of the switching transistor 100 shown in FIGS. 1A to 1C. Hence, the parasitic capacitance is small. Accordingly, the display pixel 200 according to this embodiment can reduce the dependency on $V_{ON(EL)}$ and can restrain the capacity of threshold compensation from being decreased, as compared with the display pixel in which the respective switching transistors connected to the gate electrode of the drive transistor Td2 are each the switching transistor described in the comparative example. That is, image display with high precision can be provided. Specific description thereof is given below.

First, the reduction in the dependency of the gate-source voltage $V_{GS}$ on the source voltage ($V_{ON(EL)}$) of the drive transistor Td2 at the emission of light is described.

When the anode-cathode voltage of the EL element 201 at the emission of light is $V_{OLED}$, the source voltage $V_{ON(EL)}$ of the drive transistor Td2 at the emission of light is expressed by Expression (5) as follows:

$$V_{ON(EL)} = VSS + V_{OLED} \quad (5).$$

That is, the source voltage $V_{ON(EL)}$ of the drive transistor Td2 at the emission of light is affected by the voltage of the negative power source line 212. Hence, as it is found from the second term to the last (third term) in Expression (4), the gate-source voltage $V_{GS}$ of the drive transistor Td2 is affected by the voltage of the negative power source line 212. Consequently, the pixel current of the display pixel 200 is affected by the voltage of the negative power source line 212.

Figure 5:
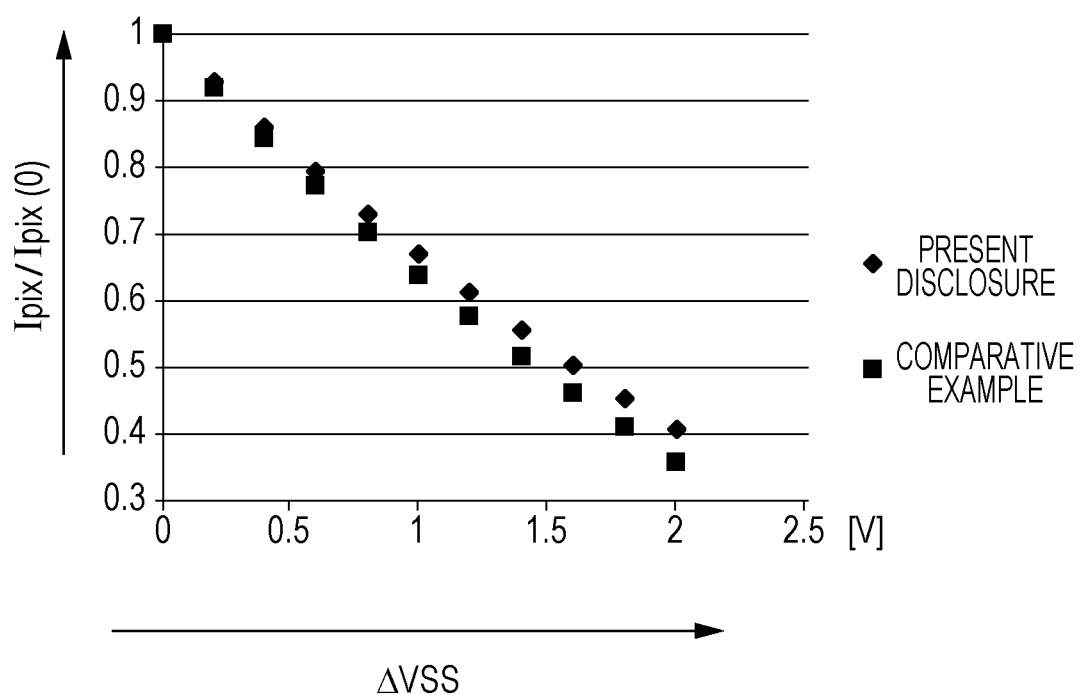
FIG. 5 is a graph showing the variation ratio of pixel current with respect to the variation of a cathode voltage.

FIG. 5 is a graph showing the variation ratio of pixel current with respect to the variation of the cathode voltage VSS. The drawing shows a variation ratio Ipix/Ipix(0) of the pixel current with respect to a variation ΔVSS of the cathode voltage VSS.

As shown in the drawing, in the display pixel 200 according to this embodiment (written as present disclosure in the drawing), the variation ratio of the pixel current is reduced as compared with the display pixel including the switching transistor described in the comparative example (hereinafter, written as display pixel according to the comparative example). That is, in the display pixel 200 according to this embodiment, the pixel current is less affected by the variation of the cathode voltage VSS, as compared with the display pixel according to the comparative example.

That is, in the display pixel 200 according to this embodiment, by decreasing the parasitic capacitances of the switching transistors (switching transistors T21 and T22) connected to the gate electrode of the drive transistor Td2, the dependency of the gate-source voltage $V_{GS}$ on the source voltage $V_{ON(EL)}$ of the drive transistor Td2 can be reduced. Hence, in the display pixel 200 according to this embodiment, the pixel current is less affected by the variation of the cathode voltage VSS, as compared with the display pixel according to the comparative example.

In this case, the voltage reduction amount of the voltage of the negative power source line 212 is increased toward a center portion of the display screen. Hence, the pixel current of the display pixel 200 at the center portion of the display screen is more affected by the voltage reduction of the negative power source line 212.

Figure 6A:
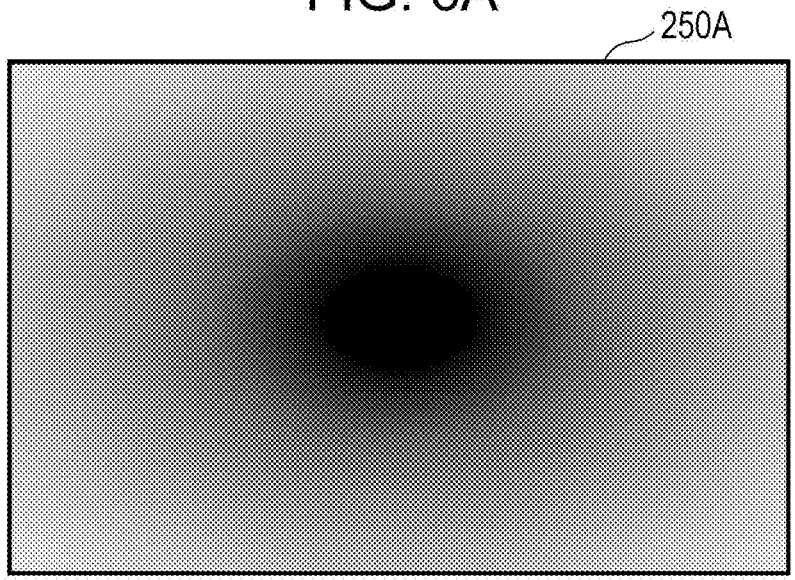
FIG. 6A is an illustration showing an example of a display screen according to a comparative example.
Figure 6B:
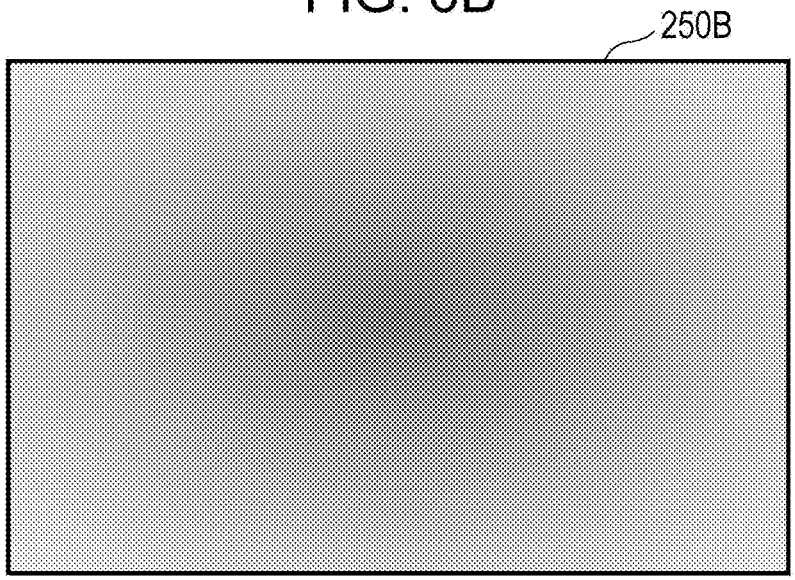
FIG. 6B is an illustration showing an example of a display screen according to the first embodiment.

FIG. 6A is an illustration showing an example of the display screen according to the comparative example. FIG. 6B is an illustration showing an example of the display screen according to this embodiment. It is to be noted that a display screen 250A shown in FIG. 6A and a display screen 250B shown in FIG. 6B are both screens displayed as the result when the same luminance signal is given to the all display pixels.

As shown in FIG. 6A, the display screen 250A according to the comparative example is affected by the voltage reduction of the negative power source line 212, and the center portion of the display screen is darker than other portion. That is, unevenness is generated in the display screen.

In contrast, as described above, the pixel current of the display pixel 200 according to this embodiment is less affected by the variation of the cathode voltage VSS, as compared with the display pixel according to the comparative example. Hence, the pixel current is less affected by the voltage reduction of the negative power source line 212. Therefore, as shown in FIG. 6B, the display screen 250B according to this embodiment can reduce the unevenness of the display screen, as compared with the display screen 250A shown in FIG. 6A. That is, in the display pixel 200 according to this embodiment, since the dependency of the gate-source voltage $V_{GS}$ on the source voltage $V_{ON(EL)}$ of the drive transistor Td2 can be reduced, the unevenness of the display screen can be reduced.

Next, the restriction of the decrease in capacity of threshold compensation is described.

As it is found from the last term (fourth term) in Expression (4), the coefficient of $V_{th}$ for the gate-source voltage $V_{GS}$ of the drive transistor Td2 can become more close to 1 as the combined parasitic capacitance Cp is smaller. That is, the threshold voltage can be compensated with high accuracy.

In the display pixel 200 according to this embodiment, the switching transistors (switching transistors T21 and T22) connected to the gate electrode of the drive transistor Td2 each have the configuration of the switching transistor 100 shown in FIGS. 1A to 1C. Hence, the parasitic capacitance is small.

Hence, in the display pixel 200 according to this embodiment, the coefficient of $V_{th}$ in Expression (4) can become more close to 1, as compared with the display pixel according to the comparative example. That is, the threshold voltage can be compensated with high accuracy. In other words, the capacity of threshold compensation can be restrained from being decreased.

Also, the display pixel 200 according to this embodiment provides the following advantages. That is, since the parasitic capacitances of the switching transistors T21 and T22 can be decreased, a wiring load of a control line that controls conduction and non-conduction of the switching transistors T21 and T22 can be decreased. Accordingly, display at a high frame rate can be supported.

Advantages

As described above, according to this embodiment, in the switching transistor 100 connected to the gate electrode of the drive transistor, the width of the channel region is smaller than the width of the region of the semiconductor layer 103 other than the channel region. Hence, the parasitic capacitance of the switching transistor 100 can be decreased. Accordingly, the parasitic capacitance accompanying the gate electrode of the drive transistor Td2 can be decreased. Consequently, image display with high precision can be provided.

To be specific, in the display pixel 200 according to this embodiment, the switching transistors T21 and T22 each have the configuration of the above-described switching transistor 100. Hence, image display with high precision, such as the reduction in the unevenness of the display screen, the restriction of the decrease in capacity of threshold compensation, and the support of the display at a high frame rate, can be provided.

Also, the semiconductor layer 103 may be made of an oxide semiconductor. Accordingly, the electron mobility can be large while the current of the switching transistor 100 in the off-state is suppressed. High drive capacity can be provided.

Also, the switching transistor 100 includes the etching stopper layer 104 provided on the semiconductor layer in a region where the source electrode 105s or the drain electrode 105d is not provided.

Accordingly, when the source electrode 105s and the drain electrode 105d of the switching transistor 100 are formed by etching, the semiconductor layer 103 can be protected from an etching damage.

The gate electrode 101 may not overlap the entire region of the contact region (the region of the semiconductor layer 103 other than the channel region) in plan view, and may overlap at least part of the contact region. Also, the switching transistor 100 may not include the etching stopper layer 104.

Also, the semiconductor layer of the drive transistor Td2 may have a length in the channel width direction being substantially constant along the channel length direction.

Accordingly, the ON characteristics of the drive transistor Td2 can be restrained from being degraded.

Also, the semiconductor layer may have a small-width portion to decrease the parasitic capacitance of the drive transistor Td2. Accordingly, the combined parasitic capacitance CF can be decreased, and the luminance of the display pixel can become close to the ideal luminance.

Second Embodiment

Next, a display device according to a second embodiment is described. The display device according to this embodiment is different from the display device according to the first embodiment in the configuration and operation of the display pixel. This embodiment is described below mainly for the points different from those of the first embodiment.

Display Pixel

The display pixel according to this embodiment includes the above-described switching transistor 100 and the drive transistor, the gate electrode of which is connected to the switching transistor 100. The display pixel according to this embodiment is specifically described below.

Configuration

Figure 7A:
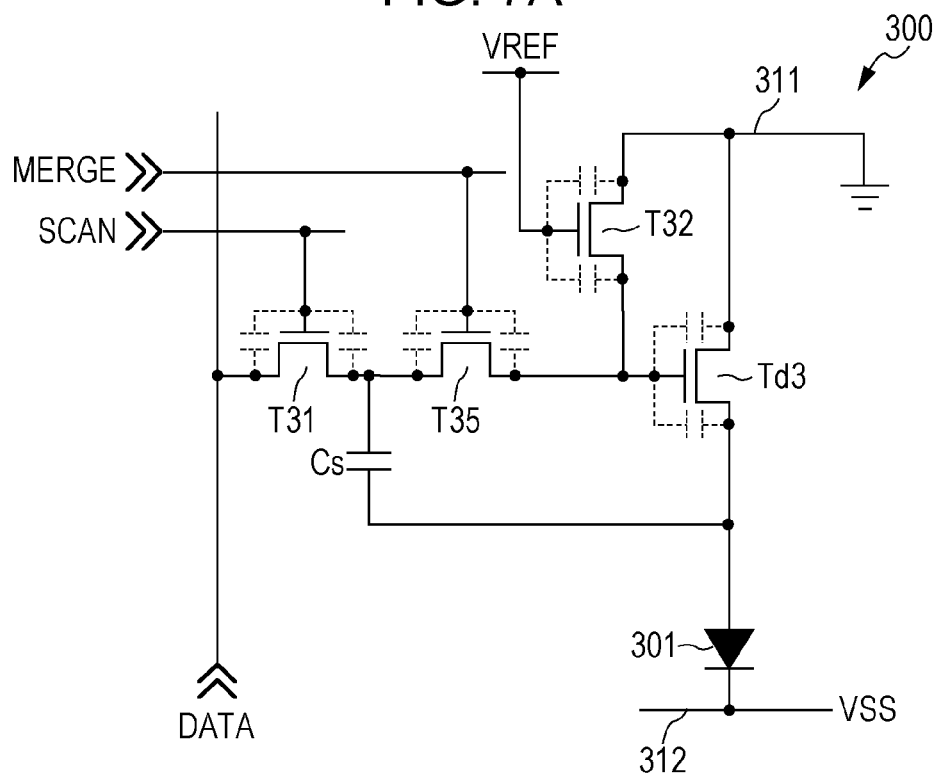
FIG. 7A is a circuit diagram showing an example of the configuration of a display pixel according to a second embodiment.

FIG. 7A is a circuit diagram showing an example of the configuration of the display pixel according to this embodiment. It is to be noted that a capacitance plotted with dotted lines in the same circuit diagram is a parasitic capacitance of each component connected to a gate electrode of a drive transistor Td3. Parasitic capacitances of other components are omitted.

As shown in the drawing, a display pixel 300 according to this embodiment includes an EL element 301, the drive transistor Td3, and switching transistors T31, T32, and T35, source electrodes or drain electrodes of which are connected to the gate electrode of the drive transistor Td3. The display pixel 300 further includes a storage capacitor Cs.

The EL element 301 is an example of a luminescence element and emits light in accordance with supplied current.

An anode of the EL element 301 is connected to a positive power source line 311 with a GND potential through the drive transistor Td3. A cathode of the EL element 301 is connected to a negative power source line 312. A voltage VSS is applied to the negative power source line 312.

The drive transistor Td3 supplies current corresponding to a luminance signal to the EL element 301.

A first electrode of the storage capacitor Cs is in conduction with the gate electrode of the drive transistor Td3 through the switching transistor T35. A second electrode of the storage capacitor Cs is in conduction with a source electrode of the drive transistor Td3 and the anode of the luminescence element. The storage capacitor Cs holds a voltage corresponding to the luminance signal.

The switching transistor T35 is an example of a first switch, and is, for example, TFT. A source electrode or a drain electrode of the switching transistor T35 is connected to the gate electrode of the drive transistor Td3.

The switching transistor T31 is an example of a second switch, and is, for example, TFT. A source electrode or a drain electrode of the switching transistor T31 is connected to the gate electrode of the drive transistor Td3 through the switching transistor T35. The switching transistor T31 switches between conduction and non-conduction of between a signal line for supplying the luminance signal and the first electrode of the storage capacitor Cs.

The switching transistor T32 is an example of a third switch, and is, for example, TFT. A source electrode or a drain electrode of the switching transistor T32 is connected to the gate electrode of the drive transistor Td3. For example, the switching transistor T32 switches between conduction and non-conduction of between the positive power source line 311 with the GND potential and the gate electrode of the drive transistor Td3.

The switching transistors T31, T32, and T35 each have the configuration of the above-described switching transistor 100.

Operation

Figure 7B:
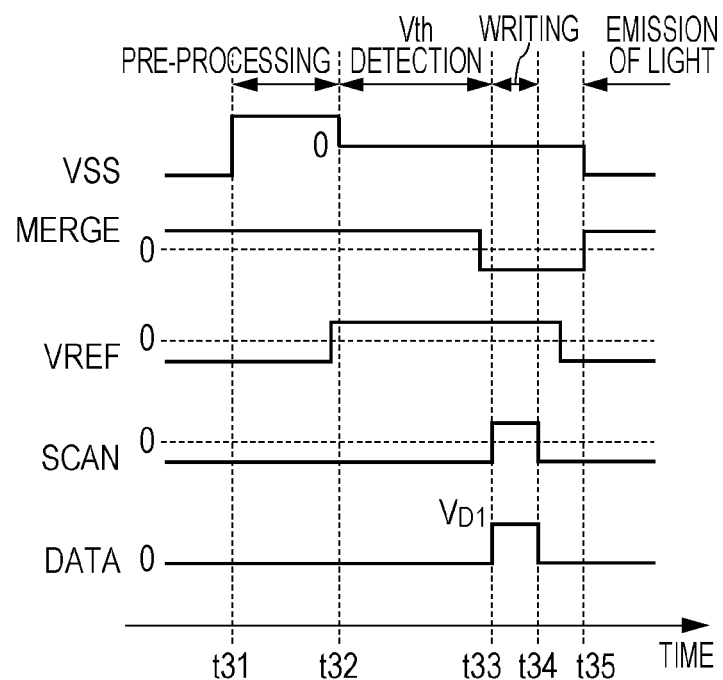
FIG. 7B is a timing chart showing an example of the operation of the display pixel according to the second embodiment.

Next, the operation of the thus configured display pixel 300 according to this embodiment is described. FIG. 7B is a timing chart showing an example of the operation of the display pixel 300 according to this embodiment. The drawing shows respective voltage waveforms of the voltage VSS of the negative power source line 312, MERGE which is a signal applied to a gate of the switching transistor T35, VREF which is a signal applied to a gate of the switching transistor T32, SCAN which is a signal applied to a gate of the switching transistor T31, and the voltage of the luminance signal DATA.

First, at time t31, while the voltage level of MERGE is maintained at HIGH and the voltage levels of VREF and SCAN are maintained at LOW, the voltage level of VSS is switched from a negative potential to a positive potential. That is, at time t31, while the switching transistor T35 is in the conductive state (on-state) and the switching transistors T31 and T32 are in the non-conductive state (off-state), the cathode voltage of the EL element 301 becomes a positive potential.

Hence, current flows to the drive transistor Td3 in the opposite direction to the direction at the emission of light, and an electric charge is stored on the EL element 301. Hence, the EL element 301 becomes reverse biased.

Then, in a pre-processing period shown in FIG. 7B, while the voltage level of MERGE is at HIGH, the voltage level of VREF is switched from LOW to HIGH. Hence, the switching transistor T35 becomes the conductive state (on-state), and the switching transistor T32 becomes the conductive state (on-state). Since the switching transistor T32 is operated at this timing, a phenomenon in which the reverse bias voltage held in the capacitance of the EL element 301 is discharged to the positive power source line 311 can be effectively suppressed.

Then, at time t32, while the voltage level of MERGE is maintained at HIGH, the voltage level of SCAN is maintained at LOW, and the voltage level of VREF is maintained at HIGH, the voltage level of VSS is switched from a positive potential to 0 potential. That is, at time t32, while the switching transistors T32 and T35 are in the conductive state (on-state) and the switching transistor T31 is in the non-conductive state (off-state), the cathode voltage of the EL element 301 becomes 0 potential.

Accordingly, the gate-source voltage of the drive transistor Td3 becomes higher than the threshold voltage based on the negative electric charge stored at the anode side of the EL element 301. Then, the drive transistor Td3 becomes the conductive state (on-state). Also, the drain electrode of the drive transistor Td3 is electrically connected to the positive power source line 311 with the GND potential. In contrast, the source electrode of the drive transistor Td3 is connected to the EL element 301 storing the negative electric charge. Hence, a potential difference is generated between the gate electrode and the source electrode of the drive transistor Td3, and current flows from the drain electrode to the source electrode. Since the current flows, the absolute value of the negative electric charge stored in the EL element 301 is gradually decreased. Also, the gate-source voltage of the drive transistor Td3 is gradually decreased.

When the gate-source voltage of the drive transistor Td3 is decreased to the threshold voltage (=Vth), the drive transistor Td3 becomes the non-conductive state (off-state), and the decrease in absolute value of the negative electric charge stored in the EL element 301 is also stopped. At this time, the gate-source voltage of the drive transistor Td3 has a potential difference corresponding to the threshold of the drive transistor Td3. This voltage is held (stored) in the storage capacitor Cs.

Then, in the Vth detection period shown in FIG. 7B, after the voltage level of MERGE is switched from HIGH to LOW, at time t33, while the voltage level of MERGE is maintained at LOW, the voltage level of VREF is maintained at HIGH, and the voltage level of VSS is maintained at 0 potential, the voltage level of SCAN is switched from LOW to HIGH. That is, at time t33, while the switching transistor T32 is in the conductive state (on-state) and the switching transistor T35 is in the non-conductive state (off-state), the switching transistor T31 becomes the conductive state (on-state).

At this time, simultaneously, the voltage of the luminance signal DATA is changed to a potential $V_{D1}$ corresponding to the luminance of the EL element 301, and the potential $V_{D1}$ is written in the storage capacitor Cs through the switching transistor T31. Then, the written potential is stored (held) in the storage capacitor Cs.

Then, at time t34, while the voltage level of MERGE is maintained at LOW, the voltage level of VREF is maintained at HIGH, and the voltage level of VSS is maintained at 0 potential, the voltage level of SCAN is switched from HIGH to LOW. That is, at time t34, while the switching transistor T32 is in the conductive state (on-state) and the switching transistor T35 is in the non-conductive state (off-state), the switching transistor T31 is switched to the non-conductive state (off-state).

Accordingly, the voltage is stably held in the storage capacitor Cs.

Then, the voltage level of VREF is switched from HIGH to LOW. That is, the switching transistor T32 is switched from the conductive state (on-state) to the non-conductive state (off-state).

Then, at time t35, while the voltage levels of VREF and SCAN are maintained at LOW, the voltage level of MERGE is switched from LOW to HIGH, and the voltage level of VSS is switched from 0 potential to the negative potential. That is, at time t35, while the switching transistors T31 and T32 are in the non-conductive state (off-state), the switching transistor T35 becomes the conductive state (on-state).

Accordingly, the drive transistor Td3 supplies current corresponding to the voltage stored in the storage capacitor Cs to the EL element 301. Consequently, the EL element 301 emits light.

The source voltage of the drive transistor Td3 at this time, that is, the anode voltage of the EL element 301 is affected by the voltage of the negative power source line 312 as expressed in Expression (5). Consequently the pixel current of the display pixel 300 is affected by the voltage of the negative power source line 312, like the pixel current of the display pixel 200 according to the first embodiment.

In this embodiment, the respective switching transistors (switching transistors T31, T32, and T35) connected to the gate electrode of the drive transistor Td3 each have the configuration of the above-described switching transistor 100. Hence, the parasitic capacitances of the switching transistors (switching transistors T31, T32, and T35) can be decreased. Accordingly, the dependency of the gate-source voltage of the drive transistor Td3 on the source voltage ($V_{ON(EL)}$) of the drive transistor Td3 at the emission of light can be reduced. Therefore, the pixel current of the display pixel 300 according to this embodiment is less affected by the voltage reduction of the negative power source line 312, like the display pixel 200 according to the first embodiment. Consequently, the display device according to this embodiment can reduce the unevenness of the display screen, like the display device according to the first embodiment.

Also, as described in the first embodiment, regarding the gate-source voltage of the drive transistor Td3, the capacity of threshold compensation can be more restrained from being decreased as the combined parasitic capacitance Cp is smaller. In the display pixel 300 according to this embodiment, the switching transistors (switching transistors T31, T32, and T35) connected to the gate electrode of the drive transistor Td3 each have the configuration of the switching transistor 100 shown in FIGS. 1A to 1C. Hence, the parasitic capacitance is small. Therefore, the display pixel 300 according to this embodiment can compensate the threshold voltage highly accurately, like the display pixel 200 according to the first embodiment. In other words, the capacity of threshold compensation can be restrained from being decreased.

Also, in the display pixel 300 according to this embodiment, since the parasitic capacitances of the switching transistors T31, T32, and T35 can be decreased, a wiring load of a control line that controls conduction and non-conduction of the switching transistors T31, T32, and T35 can be decreased. Accordingly, display at a high frame rate can be supported, like the display pixel 200 according to the first embodiment.

Advantages

As described above, in the display pixel 300 according to this embodiment, the switching transistors T31, T32, and T35 each have the configuration of the above-described switching transistor 100. Hence, even the display pixel 300 according to this embodiment attains advantages similar to those of the first embodiment. That is, image display with high precision, such as the reduction in the unevenness of the display screen, the restriction of the decrease in capacity of threshold compensation, and the support of the display at a high frame rate, can be provided.

Third Embodiment

Next, a display device according to a third embodiment is described. The display device according to this embodiment is different from the display device according to the first embodiment in the configuration and operation of the display pixel. This embodiment is described below mainly for the points different from those of the first embodiment.

Display Pixel

The display pixel according to this embodiment includes the above-described switching transistor 100 and the drive transistor, the gate electrode of which is connected to the switching transistor 100. The display pixel according to this embodiment is specifically described below.

Configuration

Figure 8A:
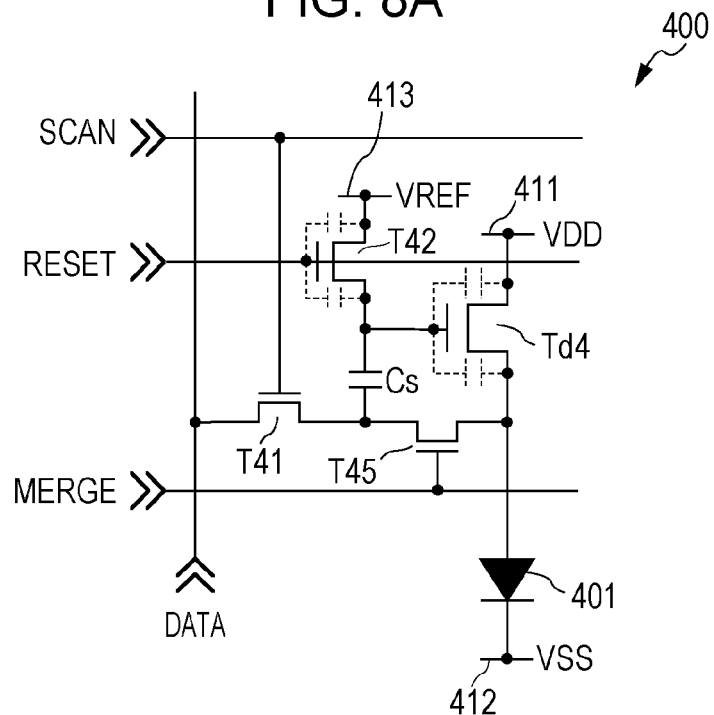
FIG. 8A is a circuit diagram showing an example of the configuration of a display pixel according to a third embodiment.

FIG. 8A is a circuit diagram showing an example of the configuration of the display pixel according to this embodiment. It is to be noted that a capacitance plotted with dotted lines in the same circuit diagram is a parasitic capacitance of each component connected to a gate electrode of a drive transistor Td4. Parasitic capacitances of other components are omitted.

As shown in the drawing, a display pixel 400 according to this embodiment includes an EL element 401, the drive transistor Td4, and a switching transistor T42, a source electrode or a drain electrode of which is connected to a gate electrode of the drive transistor Td4. The display pixel 400 further includes switching transistors T41 and T45, and a storage capacitor Cs.

The EL element 401 is an example of a luminescence element and emits light in accordance with supplied current. An anode of the EL element 401 is connected to a positive power source line 411 through the drive transistor Td4. A voltage VDD is applied to the positive power source line 411. A cathode of the EL element 401 is connected to a negative power source line 412. A voltage VSS is applied to the negative power source line 412.

The drive transistor Td4 supplies current corresponding to a luminance signal to the EL element 401.

A first electrode of the storage capacitor Cs is in conduction with the gate electrode of the drive transistor Td4. A second electrode of the storage capacitor Cs is connected to a source electrode of the drive transistor Td4 through the switching transistor T45. The storage capacitor Cs holds a voltage corresponding to a level of a luminance signal.

The switching transistor T41 is an example of a first switch, and is, for example, TFT. The switching transistor T41 switches between conduction and non-conduction of between a signal line for supplying the luminance signal and the second electrode of the storage capacitor Cs.

The switching transistor T42 is an example of a second switch, and is, for example, TFT. A source electrode or a drain electrode of the switching transistor T42 is connected to the gate electrode of the drive transistor Td4. The switching transistor T42 switches between conduction and non-conduction of between a reference power source line 413 (power source line) and the first electrode of the storage capacitor Cs. A voltage VREF is applied to the reference power source line 413. The voltage VREF is desirably set to satisfy VREF−VSS<Vth(Td4)+Vth(EL). In the above expression, Vth(Td4) is a threshold voltage of the drive transistor Td4. Vth(EL) is an emission start voltage of the EL element 401.

The switching transistor T45 is an example of a third switch, and is, for example TFT. The switching transistor T45 switches between conduction and non-conduction of between the second electrode of the storage capacitor Cs and the source electrode of the drive transistor Td4.

In this case, the switching transistor T42 has the configuration of the above-described switching transistor 100.

Operation

Figure 8B:
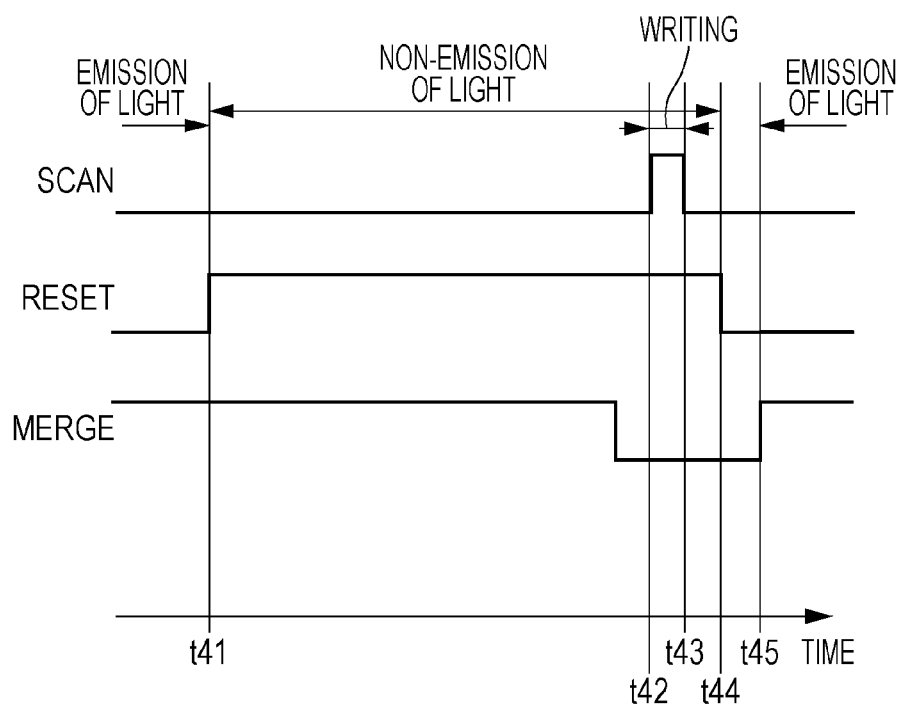
FIG. 8B is a timing chart showing an example of the operation of the display pixel according to the third embodiment.

Next, the operation of the thus configured display pixel 400 according to this embodiment is described. FIG. 8B is a timing chart showing an example of the operation of the display pixel 400 according to this embodiment. The drawing shows respective voltage waveforms of SCAN which is a signal applied to a gate of the switching transistor T41, RESET which is a signal applied to a gate of the switching transistor T42, and MERGE which is a signal applied to a gate of the switching transistor T45.

First, at time t41, while the voltage level of SCAN is maintained at LOW and the voltage level of MERGE is maintained at HIGH, the voltage level of RESET is switched from LOW to HIGH. That is, at time t41, while the switching transistor T41 is in the non-conductive state (off-state) and the switching transistor T45 is in the conductive state (on-state), the switching transistor T42 becomes the conductive state (on-state).

Accordingly, the voltages of the first electrode of the storage capacitor Cs and the gate electrode of the drive transistor Td4 become VREF. Also, the drive transistor Td4 becomes the off-state, and the supply of current from the drive transistor Td4 to the EL element 401 is stopped.

Then, by switching the voltage level of MERGE from HIGH to LOW, the switching transistor T45 becomes the non-conductive state (off-state).

Then, at time t42, while the voltage level of RESET is maintained at HIGH and the voltage level of MERGE is maintained at LOW, the voltage level of SCAN is switched from LOW to HIGH. That is, at time t42, while the switching transistor T42 is in the conductive state (on-state) and the switching transistor T45 is in the non-conductive state (off-state), the switching transistor T41 becomes the conductive state (on-state).

Accordingly, the voltage of the second electrode of the storage capacitor Cs is set at the voltage of the luminance signal DATA. Since the voltage of the first electrode of the storage capacitor Cs is set at VREF, the differential voltage between VREF and the voltage of the luminance signal is stored (held) in the storage capacitor Cs.

Then, at time t43, while the voltage level of RESET is maintained at HIGH and the voltage level of MERGE is maintained at LOW, the voltage level of SCAN is switched from HIGH to LOW. That is, at time t43, while the switching transistor T42 is in the conductive state (on-state) and the switching transistor T45 is in the non-conductive state (off-state), the switching transistor T41 becomes the non-conductive state (off-state).

Accordingly, the writing of the voltage of the luminance signal DATA is completed. In this way, since the switching transistor T45 becomes the non-conductive state (off-state), drain current is restrained from flowing to the switching transistor T41 through the drive transistor Td4. Hence, the potential of the second electrode of the storage capacitor Cs can be restrained from varying. That is, the storage capacitor Cs can correctly hold the differential voltage between VREF and the voltage of the luminance signal.

Then, at time t44, while the voltage levels of SCAN and MERGE are maintained at LOW, the voltage level of RESET is switched from HIGH to LOW. That is, at time t44, while the switching transistors T41 and T45 are in the non-conductive state (off-state), the switching transistor T42 becomes the non-conductive state (off-state).

Then, at time t45, while the voltage levels of SCAN and RESET are maintained at LOW, the voltage level of MERGE is switched from LOW to HIGH. That is, at time t45, while the switching transistors T41 and T42 are in the non-conductive state (off-state), the switching transistor T45 becomes the conductive state (on-state).

Accordingly, the drive transistor Td4 supplies current corresponding to the voltage stored in the storage capacitor Cs to the EL element 401. Consequently, the EL element 401 emits light.

The source voltage of the drive transistor Td4 at this time, that is, the anode voltage of the EL element 401 is affected by the voltage of the negative power source line 412 as expressed in Expression (5). Consequently the pixel current of the display pixel 400 is affected by the voltage of the negative power source line 412, like the pixel current of the display pixel 200 according to the first embodiment.

In this embodiment, the switching transistor T42 connected to the gate electrode of the drive transistor Td4 has the configuration of the above-described switching transistor 100. Hence, the parasitic capacitance of the switching transistor T42 can be decreased. Accordingly, the dependency of the gate-source voltage of the drive transistor Td4 on the source voltage ($V_{ON(EL)}$) of the drive transistor Td4 at the emission of light can be reduced. Therefore, the pixel current of the display pixel 400 according to this embodiment is less affected by the voltage reduction of the negative power source line 412, like the display pixel 200 according to the first embodiment. Consequently, the display device according to this embodiment can reduce the unevenness of the display screen, like the display device according to the first embodiment.

Also, in the display pixel 400 according to this embodiment, the parasitic capacitance of the switching transistor T42 can be decreased. Hence, a wiring load of a control line that controls conduction and non-conduction of the switching transistor T42 can be decreased. Accordingly, display at a high frame rate can be supported, like the display pixel 200 according to the first embodiment.

Advantages

As described above, in the display pixel 400 according to this embodiment, the switching transistor T42 has the configuration of the above-described switching transistor 100. Hence, even the display pixel 400 according to this embodiment attains advantages substantially similar to those of the first embodiment. That is, the unevenness of the display screen can be reduced, and the display at a high frame rate can be supported. That is, image display with high precision can be provided.

Other Embodiments

The embodiments have been described above as examples of techniques disclosed in the subject application. However, the techniques in the present disclosure are not limited thereto, and may be applicable to embodiments which are properly modified, replaced, added, omitted, and so forth. Also, a new embodiment may be made by combining the respective components described in the embodiments.

Therefore, other embodiments are collectively described below.

For example, the circuit configuration of the display pixel in the display device according to the present disclosure is not limited to any of the above-described circuit configurations, and may be a circuit configuration having other configuration. Also, the operation of the display pixel is not limited to the operation shown in any of the timing charts, and may have other operation. Also, each transistor in the display pixel may be a P-channel transistor or an N-channel transistor.

Also, in the above description, the EL element is used as an example of a luminescence element. However, the luminescence element is not limited to the EL element, and may be any kind of current-to-light conversion device as long as the device has a light emission intensity which varies in accordance with current.

Also, for example, a configuration in which an element, such as a transistor, a resistive element, or a capacitative element, is connected in series or parallel to a certain element within a range that can provide a function similar to the function of the above-described circuit configuration is included in the present disclosure. In other words, expression "being connected" in any of the above-described embodiments is not limited to a case of directly connecting two terminals (nodes), and may include a case of connecting the two terminals (nodes) through an element within the range that can provide a similar function.

Also, the numerical values used in the above description are merely examples for specifically describing the present disclosure, and the present disclosure is not limited to the exemplified numerical values.

For example, the width c of the channel region is not limited to aforementioned 4 μm, and may be any value as long as it is smaller than the width g of the contact region. At this time, the lower limit value of the width of the channel region may be any value as long as the value satisfies characteristics requested to a transistor to which the switching transistor 100 is applied. For example, if the switching transistor 100 is applied to a write voltage transistor of a luminance signal connected to a signal line for supplying the luminance signal DATA, the width c of the channel region may be a value that satisfies characteristics (for example, electron mobility) that allows the writing of the luminance signal to be completed during the writing period.

Also, the series of operations of causing the EL element 201 to emit light through the bootstrap operation of the drive transistor Td2 after the completion of writing the luminance signal DATA as described in the first embodiment may be applied to other embodiment.

Also, such a series of operations may be provided by a controller that controls conduction and non-conduction of each switching transistor of the display pixel.

Figure 9:
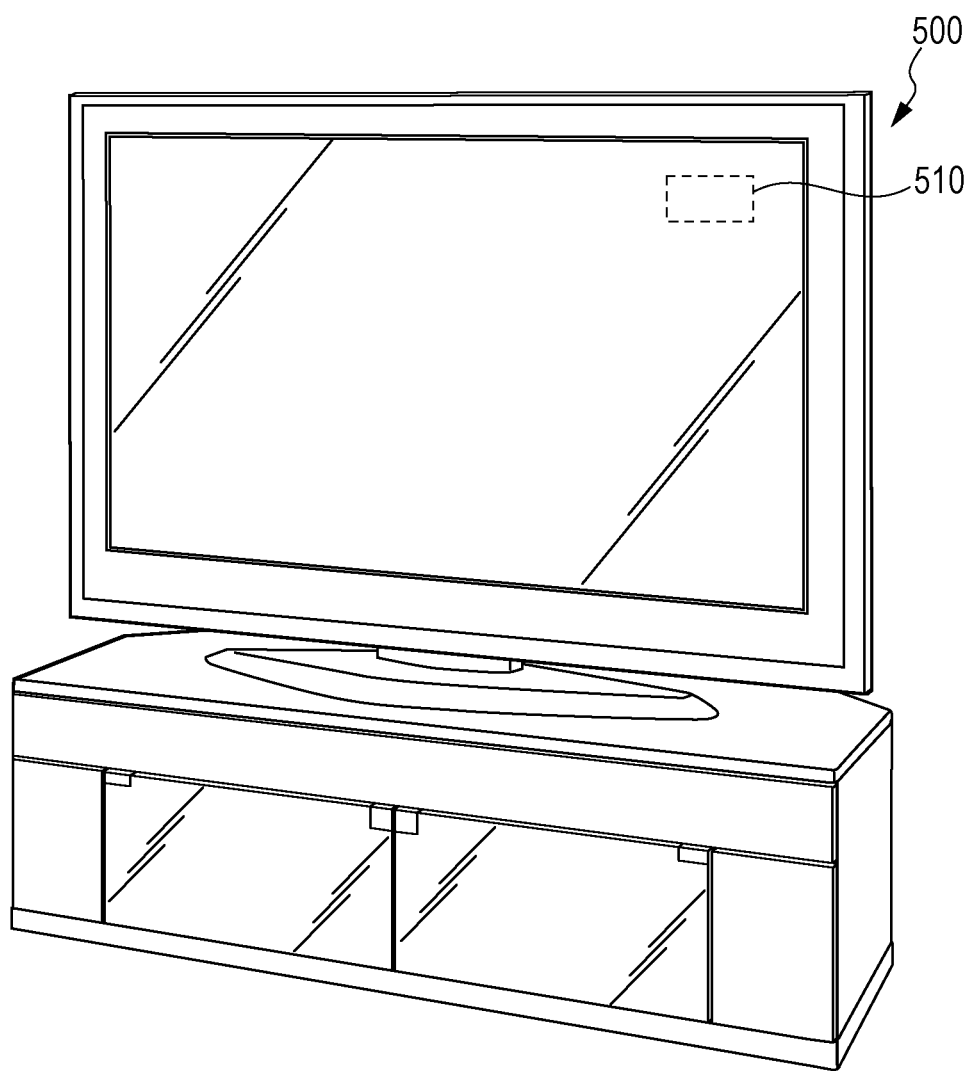
FIG. 9 is an external view of a thin flat television system including a display device according to the present disclosure.

For example, the display device according to each embodiment may be provided as a FPD display device such as a television system as shown in FIG. 9. In this case, a display device 500 shown in the drawing may include a controller 510. The controller 510 may cause the storage capacitor Cs to hold a voltage corresponding to the level of the luminance signal DATA; after the holding, execute a bootstrap operation that is an operation of changing a potential of the gate electrode of the drive transistor by changing a potential of the source electrode of the drive transistor by current flowing to the drive transistor, by causing the first electrode of the storage capacitor Cs to be in conduction with the gate electrode of the drive transistor and causing the second electrode of the storage capacitor Cs to be in conduction with the source electrode of the drive transistor; and cause the EL element (luminescence element) to emit light through the bootstrap operation.

As described above, the embodiments have been described as examples of techniques disclosed in the present disclosure. Hence, the accompanying drawings and the detailed description have been provided.

Therefore, the components illustrated in the accompanying drawings and described in the detailed description may include components not essential for addressing the problems to exemplarily show the aforementioned techniques, in addition to components essential for addressing the problems. Owing to this, even though the nonessential components are illustrated in the accompanying drawings or described in the description, it should not be immediately recognized that these nonessential components are essential.

Also, the above-described embodiments are provided for exemplarily showing the techniques in the present disclosure, and therefore may be modified, replaced, added, omitted, and so forth, in various ways within the scope of the claims or within the scope of equivalent.

The present disclosure can be used for a display device, and more particularly used for a FPD display device such as a television system.

What is claimed is:

1. A display device, comprising:
    a plurality of arrayed display pixels, each of the display pixels comprising:
    a luminescence element that emits light in accordance with a current;
    a drive transistor that includes a first gate electrode and supplies a current corresponding to a level of a luminance signal to the luminescence element; and
    a switching transistor that includes a source electrode, a drain electrode, a second gate electrode and a semiconductor layer, the semiconductor layer being faced with the second gate electrode and having, in a channel width direction perpendicular to a channel length direction of the switching transistor, a channel region with a first width and a remainder region with a second width larger than the first width, either the source electrode or the drain electrode being connected to the first gate electrode, both the source electrode and the drain electrode being provided on the semiconductor layer at an interval, and the second gate electrode overlapping, in a plan view, the channel region and the semiconductor layer entirely, and the remainder region at least partially.

2. The display device according to claim 1, wherein the semiconductor layer includes an oxide semiconductor.

3. The display device according to claim 1, wherein the switching transistor further comprises an etching stopper layer, the etching stopper layer being provided on the semiconductor layer and having a plurality of through holes corresponding to the source electrode and the drain electrode of the switching transistor.

4. The display device according to claim 1, wherein the drive transistor further comprises a source electrode and a drain electrode, the luminescence element further comprises an anode, and each of the display pixels further comprises:
    a storage capacitor having a first electrode being in conduction with the first gate electrode of the drive transistor, and a second electrode being in conduction with the source electrode of the drive transistor and the anode of the luminescence element, the storage capacitor being configured to hold a voltage corresponding to the level of the luminance signal;
    a first switch having either a source electrode or a drain electrode of the first switch being connected to the first gate electrode of the drive transistor, the first switch being configured to switch conduction and non-conduction between a signal line for supplying the luminance signal and the first electrode of the storage capacitor;
    a second switch having either a source electrode or a drain electrode of the second switch being connected to the first gate electrode of the drive transistor, the second switch being configured to switch conduction and non-conduction between a first power source line and the first electrode of the storage capacitor;
    a third switch that switches conduction and non-conduction between the second electrode of the storage capacitor and a second power source line; and
    a fourth switch that switches conduction and non-conduction between a third power source line and the drain electrode of the drive transistor, and
    wherein each of the first switch and the second switch having a configuration of the switching transistor, and
    wherein each of the first switch, the second switch, the third switch, and the fourth switch is separately disposed.

5. The display device according to claim 4, further comprising:
    a controller configured to:
    cause the storage capacitor to hold the voltage corresponding to the level of the luminance signal;
    after the holding of the voltage, i) the first electrode of the storage capacitor is in conduction with the first gate electrode of the drive transistor and the second electrode of the storage capacitor is in conduction with the source electrode of the drive transistor, ii) a potential of the source electrode of the drive transistor is changed by current flowing to the drive transistor, and iii) a potential of the first gate electrode of the drive transistor is changed by the changing of the potential of the source electrode of the drive transistor; and
    cause the luminescence element to emit light through the bootstrap operation.

6. The display device according to claim 1, wherein the drive transistor further comprises a source electrode, the luminescence element further comprises an anode, and each of the display pixels further comprises:
    a first switch having either a source electrode or a drain electrode of the first switch being connected to the first gate electrode of the drive transistor;
    a storage capacitor having a first electrode being in conduction with the first gate electrode of the drive transistor through the first switch, and a second electrode being in conduction with the source electrode of the drive transistor and the anode of the luminescence element, the storage capacitor being configured to hold a voltage corresponding to the level of the luminance signal;
    a second switch having either a source electrode or a drain electrode of the second switch being connected to the first gate electrode of the drive transistor through the first switch, the second switch being configured to switch conduction and non-conduction between a signal line for supplying the luminance signal and the first electrode of the storage capacitor; and
    a third switch having either a source electrode or a drain electrode of the third switch being connected to the first gate electrode of the drive transistor, the third switch being configured to switch conduction and non-conduction between a power source line and the first gate electrode of the drive transistor, and
    wherein each of the first switch, the second switch and the third switch having a configuration of the switching transistor, is separately disposed.

7. The display device according to claim 6, further comprising:
    a controller configured to:
    cause the storage capacitor to hold the voltage corresponding to the level of the luminance signal;
    after the holding of the voltage, i) the first electrode of the storage capacitor is in conduction with the first gate electrode of the drive transistor and the second electrode of the storage capacitor is in conduction with the source electrode of the drive transistor, ii) a potential of the source electrode of the drive transistor is changed by current flowing to the drive transistor, and iii) a potential of the first gate electrode of the drive transistor is changed by the changing of the potential of the source electrode of the drive transistor; and cause the luminescence element to emit light through the bootstrap operation.

8. The display device according to claim 1, wherein the drive transistor further comprises a source electrode, and each of the display pixels comprises:

a storage capacitor having a first electrode being in conduction with the first gate electrode of the drive transistor, the storage capacitor being configured to hold a voltage corresponding to the level of the luminance signal;

a first switch that switches conduction and non-conduction between a signal line for supplying the luminance signal and the second electrode of the storage capacitor;

a second switch having either a source electrode or a drain electrode of the second switch being connected to the first gate electrode of the drive transistor, the second switch being configured to switch conduction and non-conduction between a power source line and the first electrode of the storage capacitor; and a third switch that switches conduction and non-conduction between the second electrode of the storage capacitor and the source electrode of the drive transistor, and wherein the second switch is the switching transistor, and wherein each of the first switch, the second switch, and the third switch is separately disposed.

9. The display device according to claim 8, further comprising:

a controller configured to:

cause the storage capacitor to hold the voltage corresponding to the level of the luminance signal;

after the holding of the voltage, i) the first electrode of the storage capacitor is in conduction with the first gate electrode of the drive transistor and the second electrode of the storage capacitor is in conduction with the source electrode of the drive transistor, ii) a potential of the source electrode of the drive transistor is changed by current flowing to the drive transistor, and iii) a potential of the first gate electrode of the drive transistor is changed by the changing of the potential of the source electrode of the drive transistor; and cause the luminescence element to emit light through the bootstrap operation.

10. The display device according to claim 1, wherein a semiconductor layer of the drive transistor has a third width in a channel width direction perpendicular to a channel length direction of the drive transistor, the third width being substantially constant in the channel length direction of the drive transistor.

* * * * *